United States Patent [19]

Styczinski

[11] Patent Number: 5,708,668

[45] Date of Patent: *Jan. 13, 1998

[54] METHOD AND APPARATUS FOR OPERATING AN ARRAY OF STORAGE DEVICES

[75] Inventor: David Alan Styczinski, Rochester, Minn.

[73] Assignee: International Business Machines Corporation, Armonk, N.Y.

[*] Notice: The term of this patent shall not extend beyond the expiration date of Pat. No. 5,442,752.

[21] Appl. No.: 879,621

[22] Filed: May 6, 1992

[51] Int. Cl.[6] .................................................. G11C 29/00
[52] U.S. Cl. ..................... 371/40.1; 395/441; 395/182.04
[58] Field of Search ........................... 379/10.1, 10.2, 379/40.1, 40.2, 51.1; 364/DIG. 2, 200; 371/40.3, 40.4; 395/441, 182.03, 182.04, 182.05

[56] References Cited

U.S. PATENT DOCUMENTS

| | | | |
|---|---|---|---|
| 4,761,785 | 8/1988 | Clark et al. | 371/38 |
| 4,817,035 | 3/1989 | Timsit | 364/900 |
| 4,831,581 | 5/1989 | Rubinfeld | 364/200 |
| 4,914,656 | 4/1990 | Dunphy, Jr. et al. | 371/40.1 |
| 5,088,081 | 2/1992 | Farr | 369/54 |
| 5,212,784 | 5/1993 | Sparks | 371/10.1 X |
| 5,257,391 | 10/1993 | Dulac et al. | 395/800 |
| 5,258,984 | 11/1993 | Menon et al. | 371/10.2 X |
| 5,274,499 | 12/1993 | Brant et al. | 371/10.1 X |
| 5,283,791 | 2/1994 | Halford | 371/40.1 X |
| 5,313,612 | 5/1994 | Satoh et al. | 371/10.1 X |
| 5,341,381 | 8/1994 | Fuller | 371/10.1 |
| 5,442,752 | 8/1995 | Styczinski | 395/404 |

FOREIGN PATENT DOCUMENTS 0462917  12/1991  European Pat. Off.

OTHER PUBLICATIONS

IBM Technical Disclosure Bulletin, vol. 29, No. 11, Apr. 1987 "DASD Update Processing".

IBM Technical Disclosure Bulletin, vol. 29, No. 5, Oct. 1986 "Method for Scheduling Writes in a Duplexed DASD Subsystem".

Report No. UCB/CSD 88/467 Oct. 1988, Computer Science Division (EECS), University of California, Berkeley, California 94720—"Beating the I/O Bottleneck; A Case For Log-Structured File Systems" by John Ousterhout and Fred Douglis.

ACM Sigmod Conference, Chicago, Illinois, Jun. 1–3, 1988, "A Case For Redundant Arrays of Inexpensive Disks (RAID)" by David A. Patterson, Garth Gibson and Randy H. Katz (8 pages).

Primary Examiner—Roy N. Envall, Jr.
Assistant Examiner—Brian C. Oakes
Attorney, Agent, or Firm—Roy W. Truelson; Richard E. Billion

[57] ABSTRACT

A storage controller operates an array of parity protected data storage units as a RAID level 5. One of the storage units is a dedicated write assist unit. The assist unit is a temporary storage area for data to be written to the other units. When the array controller receives data from a host, it first writes the data to the assist unit. Because the assist unit is not parity protected and is only temporary storage, it is possible to write data to the assist unit sequentially, without first reading the data, greatly reducing response time. The array controller signals the CPU that the data has been written to storage as soon as it has been written to the assist unit. Parity in the array is updated asynchronously. In the event of system or storage unit failure, data can be recovered using the remaining storage units and/or the assist unit. The write assist unit also doubles as a spare unit. Data recovered from a failed unit can be stored on the write assist, which then ceases to function as a write assist unit and assumes the function of the failed storage unit.

19 Claims, 11 Drawing Sheets

WRITE ASSIST DISK RECORD FORMAT

HEADER/TRAILER BLOCK FORMAT

| Field Name | Byte Location | Sample Data |
|---|---|---|
| Command ID | 0 - 3 | X '00005D83' |
| Command Address | 4 - 7 | X '00006D28' |
| No. Status Blocks | 8 | X '01' |
| Next Address | 9 - 13 | X '00007958' |
| No. in UC List | 14 - 15 | X '0002' |
| UC List Entry #1 | 16 - N | X '00005DE0' |
| UC List Entry #2 |  | X '00006D28' |
| Padding | N - 253 | [Variable] |
| SCSI Command | 254 - 263 | X'0A4162200300..' |
| Command Extension | 263 - 519 | X 'FFF...FFF' |

METHOD AND APPARATUS FOR OPERATING AN ARRAY OF STORAGE DEVICES

FIELD OF THE INVENTION

The present invention relates to computer data storage apparatus, and in particular to arrays of direct access storage devices commonly known as "RAIDs".

BACKGROUND OF THE INVENTION

The extensive data storage needs of modern computer systems require large capacity mass data storage devices. A common storage device is the magnetic disk drive, a complex piece of machinery containing many parts which are susceptible to failure. A typical computer system will contain several such units. The failure of a single storage unit can be a very disruptive event for the system. Many systems are unable to operate until the defective unit is repaired or replaced, and the lost data restored.

As computer systems have become larger, faster, and more reliable, there has been a corresponding increase in need for storage capacity, speed and reliability of the storage devices. Simply adding storage units to increase storage capacity causes a corresponding increase in the probability that any one unit will fail. On the other hand, increasing the size of existing units, absent any other improvements, tends to reduce speed and does nothing to improve reliability.

Recently there has been considerable interest in arrays of direct access storage devices, configured to provide some level of data redundancy. Such arrays are commonly known as "RAIDs" (Redundant Array of Inexpensive Disks). Various types of RAIDs providing different forms of redundancy are described in a paper entitled "A Case for Redundant Arrays of Inexpensive Disks (RAID)", by Patterson, Gibson and Katz, presented at the ACM SIGMOD Conference, June, 1988. Patterson, et al., classify five types of RAIDs designated levels 1 through 5. The Patterson nomenclature has become standard in the industry. The underlying theory of RAIDs is that a large number of relatively small disk drives, some of which are redundant, can simultaneously provide increased capacity, speed and reliability.

Using the Patterson nomenclature, RAID levels 3 through 5 (RAID-3, RAID-4, RAID-5) employ parity records for data redundancy. Parity records are formed from the Exclusive-OR of all data records stored at a particular location on different storage units in the array. In other words, in an array of N storage units, each bit in a block of data at a particular location on a storage unit is Exclusive-ORed with every other bit at that location in a group of (N−1) storage units to produce a block of parity bits; the parity block is then stored at the same location on the remaining storage unit. If any storage unit in the array fails, the data contained at any location on the failing unit can be regenerated by taking the Exclusive-OR of the data blocks at the same location on the remaining devices and their corresponding parity block.

RAID-4 and RAID-5 are further characterized by independently operating read/write actuators in the storage units. In other words, each read/write head of a disk drive unit is free to access data anywhere on the disk, without regard to where other units in the array are accessing data. U.S. Pat. No. 4,761,785 to Clark et al., which is hereby incorporated by reference, describes a type of independent read/write array in which the parity blocks are distributed substantially equally among the storage units in the array. Distributing the parity blocks shares the burden of updating parity among the disks in the array on a more or less equal basis, thus avoiding potential performance bottlenecks that may arise when all parity records are maintained on a single dedicated disk drive unit. Patterson et el. have designated the Clark array RAID-5. RAID-5 is the most advanced level RAID described by Patterson, offering improved performance over other parity protected RAIDs.

One of the problems encountered with parity protected disk arrays having independent read/writes (i.e., RAID-4 or RAID-5) is the overhead associated with updating the parity block whenever a data block is written. Typically, as described in Clark, et el., the data block to be written is first read and the old data Exclusive-ORed with the new data to produce a change mask. The parity block is then read and Exclusive-ORed with the change mask to produce the new parity data. The data and parity blocks can then be written. Thus, two read and two write operations are required each time data is updated.

In a typical computer system, the central processing unit (CPU) operates much faster than the storage devices. The completion of the two read and two write operations by the storage devices which are necessary for updating data and parity require a comparatively long period of time in relation to CPU operations. If the CPU holds off further processing of a task until the data update in the storage devices is completed, system performance can be adversely affected. It is desirable to permit the CPU to proceed with processing a task immediately or shortly after transmitting data to the disk array for writing, while still maintaining data redundancy.

A single parity block of a RAID-3, RAID-4 or RAID-5 provides only one level of data redundancy. This ensures that data can be recovered in the event of failure of a single storage unit. However, the system must be designed to either discontinue operations in the event of a single storage unit failure, or continue operations without data redundancy. If the system is designed to continue operations, and a second unit fails before the first unit is repaired or replaced and its data reconstructed, catastrophic data loss may occur. In order to support a system that remains operational at all times, and reduces the possibility of such catastrophic data loss, it is possible to provide additional standby storage units, known as "hot spares". Such units are physically connected to the system, but do not operate until a unit fails. In that event, the data on the failing unit is reconstructed and placed on the hot spare, and the hot spare assumes the role of the failing unit. Although the hot spares technique enables a system to remain operational and maintain data redundancy in the event of a device failure, it requires additional storage units (and attendant cost) which otherwise serve no useful function.

SUMMARY OF THE INVENTION

It is therefore an object of the present invention to provide an enhanced method and apparatus for storing data in a computer system.

Another object of this invention is to provide an enhanced method and apparatus for managing a redundant array of storage devices in a computer system.

Another object of this invention is to increase the performance of a computer system having a redundant array of storage devices.

Another object of this invention to provide an enhanced method and apparatus whereby a computer system having a redundant array of storage devices may continue to operate if one of the storage units fails.

Another object of this invention to reduce the cost of providing increased performance and data redundancy in a computer system having a redundant array of storage devices.

An array storage controller services a plurality of data storage units in an array. A storage management mechanism resident on the controller maintains parity records on the storage units it services. Data and parity blocks are preferably organized as described in the patent to Clark et al. (RAID-5). The array controller contains a RAM cache for temporarily storing update data, read data, and change masks for parity generation.

One of the storage units in the array is a dedicated write assist unit. The assist unit is a temporary storage area for data to be written to other units in the array. When the array controller receives data to be written to storage, it first writes the data to the assist unit. Because the assist unit is not parity protected, it is not necessary to first read the data on the assist unit. Furthermore, because the unit is only temporary storage, it is possible to write data to the assist unit sequentially, greatly reducing seek and latency times.

The array controller signals the CPU that the data has been written to storage as soon as it has been written to the assist unit. It is still necessary to perform two read and two write operations to update the data, as described in Clark, et al. However, these operations can proceed asynchronously with further processing of the task in the CPU.

The storage management mechanism maintains status information in the array controller's memory concerning the current status of data being updated. The amount of memory required for such status information is relatively small, much smaller than the data itself. This status information, together with the write assist unit, provide data redundancy at all times. In the event of a failure of the assist unit, the array controller continues to update data from the contents of its RAM as if nothing had happened. In the event of a failure of a storage unit in the array other than the assist unit, the data on that unit can be reconstructed using the remaining units in the array (including the assist unit) and the status information. Finally, in the event of failure of the controller itself, the storage units (including the assist unit) contain information needed for complete recovery.

The write assist unit also doubles as a spare unit in the event of failure of another unit in the array. After any incomplete write operations are completed and parity updated, the data in the failed storage unit is reconstructed by Exclusive-ORing all the other units, and this data is stored on the assist unit. The assist unit then ceases to function as an assist unit, and functions as the failed storage unit that it replaced. The system then continues to operate normally, but without a write assist unit. The only effect is that data updates cause a greater impact to system performance, but data is otherwise fully protected.

BRIEF DESCRIPTION OF THE DRAWINGS

FIG. 9 shows the steps required to obtain the most recent uncommitted list from write assist disk unit during data recovery, according to the preferred embodiment;

DETAILED DESCRIPTION OF THE PREFERRED EMBODIMENT

Figure 1:
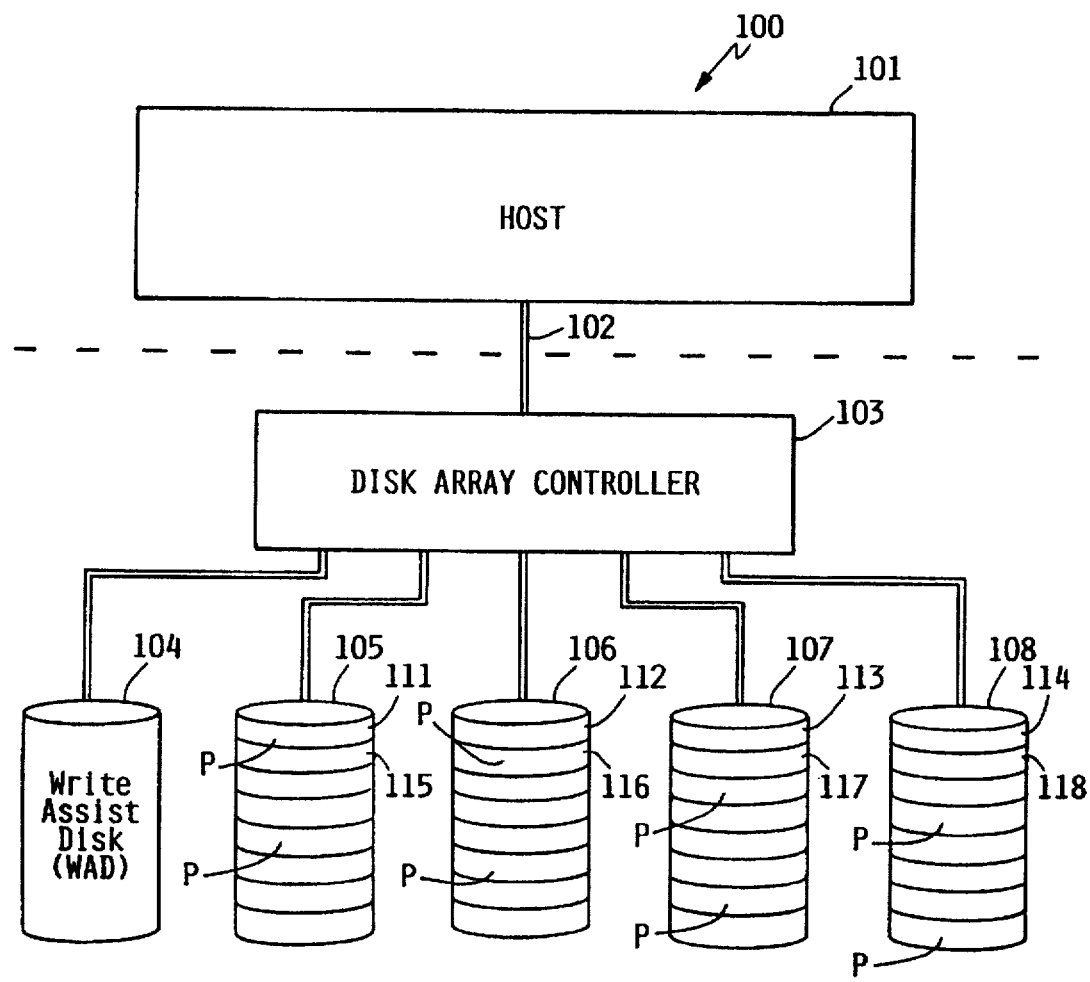
FIG. 1 is a block diagram of a system incorporating the components of the preferred embodiment of this invention.

A block diagram of the major components of computer system 100 of the preferred embodiment of the present invention is shown in FIG. 1. A host system 101 communicates over a high-speed data bus 102 with a disk array controller 103. Controller 103 controls the operation of storage units 104–108. In the preferred embodiment, units 104–108 are rotating magnetic disk drive storage units. While five storage units are shown in FIG. 1, it should be understood that the actual number of units attached to controller 103 is variable. It should also be understood that more than one controller 103 may be attached to host 101. While host 101 is depicted in FIG. 1 as a monolithic entity, it will be understood by those skilled in the art that host 101 typically comprises many elements, such as a central processing unit (CPU), main memory, internal communications busses, and I/O devices including other storage devices. In the preferred embodiment, computer system 100 is an IBM AS/400 computer system, although other computer systems could be used.

Disk unit 104 is a write assist disk unit. The remaining units 105–108 are designated service units. The write assist unit 104 is a temporary storage area for data to be written to the service units 105–108. For fast access, data is written sequentially to assist unit 104. The storage area of each service unit 105–108 is logically divided into blocks 111–118. In the preferred embodiment, disk units 104–108 are physically identical units (except for the data stored thereon) having identical storage capacity, and blocks 111–118 are the same size. While it would be possible to employ this invention in configurations of varying sized storage units or varying sized blocks, the preferred embodiment simplifies the control mechanism.

The set of all blocks located at the same location on the several service units constitute a stripe. In FIG. 1, storage blocks 111–114 constitute a first stripe, and blocks 115–118 constitute a second stripe. At least one of the blocks in each stripe is dedicated to data redundancy, and contain parity or some form of error correcting code. In the preferred embodiment, data redundancy takes the form of a single parity block in each stripe. Parity blocks 111,116 are shown designated "P" in FIG. 1. The remaining blocks 112–115, 117–118 are data storage blocks for storing data. The parity block for the stripe consisting of blocks 111–114 is block 111. The parity block contains the Exclusive-OR of data in the remaining blocks on the same stripe.

In the preferred embodiment, parity blocks are distributed across the different service disk units in a round robin manner, as shown in FIG. 1. Because with every write operation the system must not only update the block containing the data written to, but also the parity block for the same stripe, parity blocks are usually modified more frequently than data blocks. Distributing parity blocks among different service units will in most cases improve performance by distributing the access workload. However, such distribution is not necessary to practicing this invention, and in an alternate embodiment it would be possible to place all parity blocks on a single disk unit.

The allocation of storage area on the service units into stripes as described above, each containing blocks of data and a parity block, is the same as that described in U.S. Pat. No. 4,761,785 to Clark, et al., which is incorporated by reference.

Figure 2:
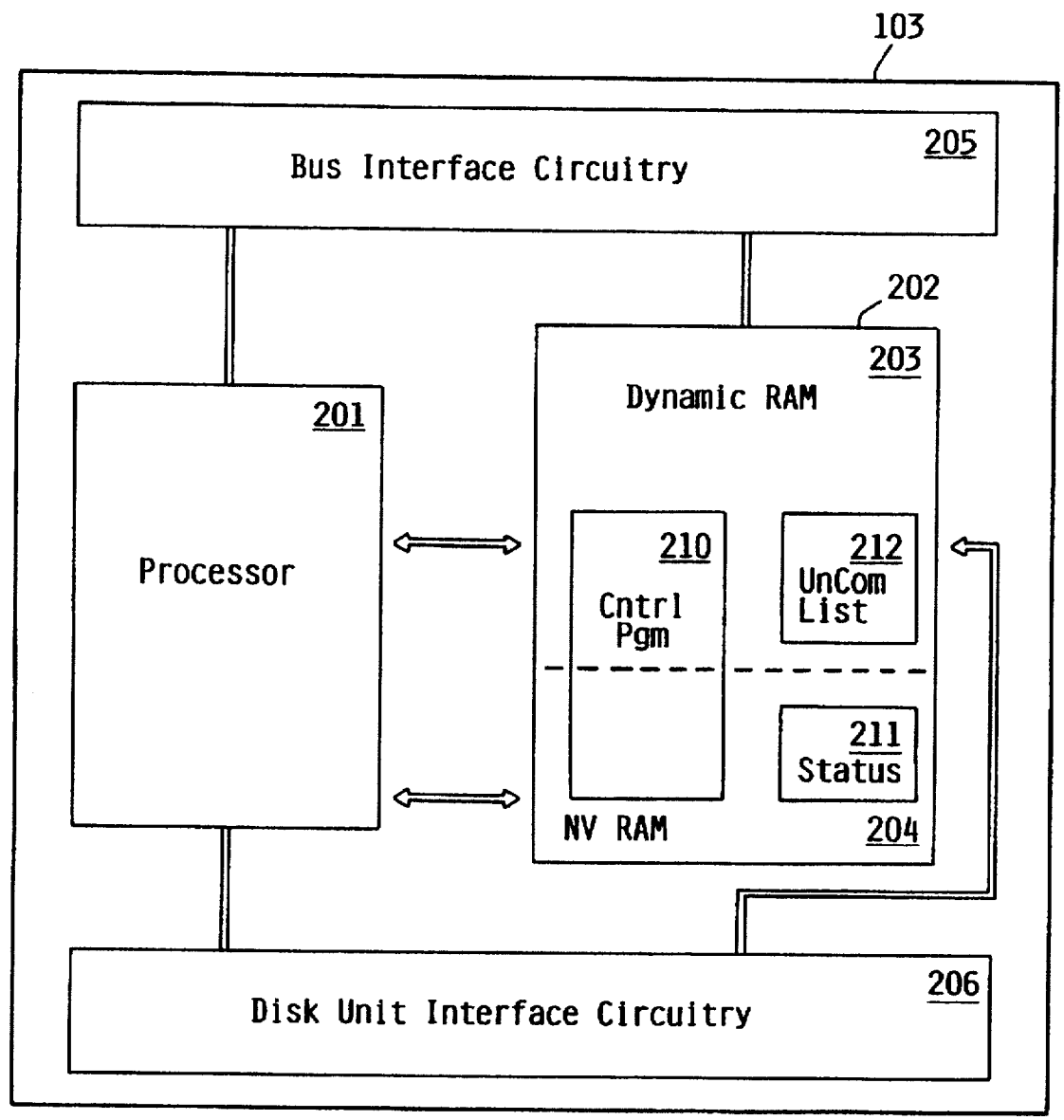
FIG. 2 is a diagram of the major components of a disk array controller according to the preferred embodiment.

Array controller 103 is shown in greater detail in FIG. 2. Controller 103 comprises programmable processor 201, random access memory (RAM) 202, bus interface circuitry 205, and disk unit interface circuitry 206, which communicate with each other via various internal communication paths as shown. Bus interface circuitry 205 sends and receives communications with host 101 via high speed bus 102. Disk unit interface circuitry 206 sends and receives communications with disk units 104–108. Programmable processor 201 controls the operation of array controller 103 by executing a storage management control program 210 resident in memory 202. Controller 103 includes means for performing Exclusive-OR operations on data which are required for maintaining parity and data recovery, as described below. Exclusive-OR operations may be performed by processor 201, or by special purpose hardware (not shown).

Memory 202 comprises dynamic RAM portion 203 and non-volatile RAM portion 204. Non-volatile RAM 204 is RAM which maintains fits data in the absence of system power. The contents of dynamic RAM 203 are lost when the system loses power. Dynamic RAM circuits using currently available technology are considerably less expensive and/or have shorter access time than non-volatile RAM. Hence, it is desirable to use dynamic RAM for storage of all but the most critical data. In the preferred embodiment, a portion of control program 210 necessary for initialization of the array controller 103 is stored in non-volatile RAM 204; the remaining part of control program 210 is loaded from host 101 when the system is initially powered-up, and stored in dynamic RAM 203, as shown in FIG. 2.

Memory 202 contains several records which support operation of the write assist unit in accordance with the preferred embodiment. Uncommitted list 212 in dynamic RAM 203 is a list representing those WRITE operations which may be incomplete. In particular, after array controller 103 receives a WRITE command from host 101, writes the data to write assist unit 104, and signals the host that the operation is complete, there will typically be some time delay before the data is actually written to the service units 105–108 and parity updated. Uncommitted list 212 records those operations which may be in such a pending status. If a device failure should occur before the data can be written to the service units and parity updated, uncommitted list 212 will be used for recovery, as described more fully below. In the preferred embodiment, uncommitted list 212 is a variable length list of addresses on assist unit 104 at which the respective incomplete WRITE operations have been stored.

Non-volatile RAM 204 contains status record 211. Status information includes an address of a recent uncommitted write operation on assist unit 104, which is used to reconstruct data in the event of loss of the contents of dynamic RAM 203, and the current status of each disk unit 104–108 in the array (i.e., whether the unit is on-line and functioning, and whether it is configured as an assist unit or a service unit). Memory 202 may include other records not shown.

In addition to control program 210 and the records described above, dynamic RAM 203 is used as a cache for temporary storage of data being read from or written to storage units 104–108.

The operation of computer system 100 in conjunction with the hardware and software features necessary to the present invention will now be described. To host 101, the array controller 103 and attached disk units 104–108 appear as a single storage entity. Host 101 issues READ and WRITE commands to array controller 103, requesting that it respectively read data from, or write data to, the disk units. Host 101 receives read data or a completion message when the respective operation is complete. Host 101 is unaware of the mechanics of updating parity and other disk maintenance performed by controller 103.

In normal operation, write assist disk unit 104 is only written to, and not used during the READ operation. Controller 103 executes a READ operation by accepting a READ command from host 101, and determining whether the data requested exists in the controller's dynamic RAM 203. If so, the data in RAM 203 is sent directly to the host. Otherwise, data is first read from the appropriate storage unit into dynamic RAM 203, and from there transferred to the host system. Depending on the size of dynamic RAM 203, data may be saved there awaiting a WRITE operation for the same data. If the original version of data to be updated is already in RAM 203 when the WRITE operation is processed, it will not be necessary to read the data again in order to update parity, thus improving system performance. In some applications, the host may be able to indicate to the controller which data read is likely to be modified.

Figure 3A:
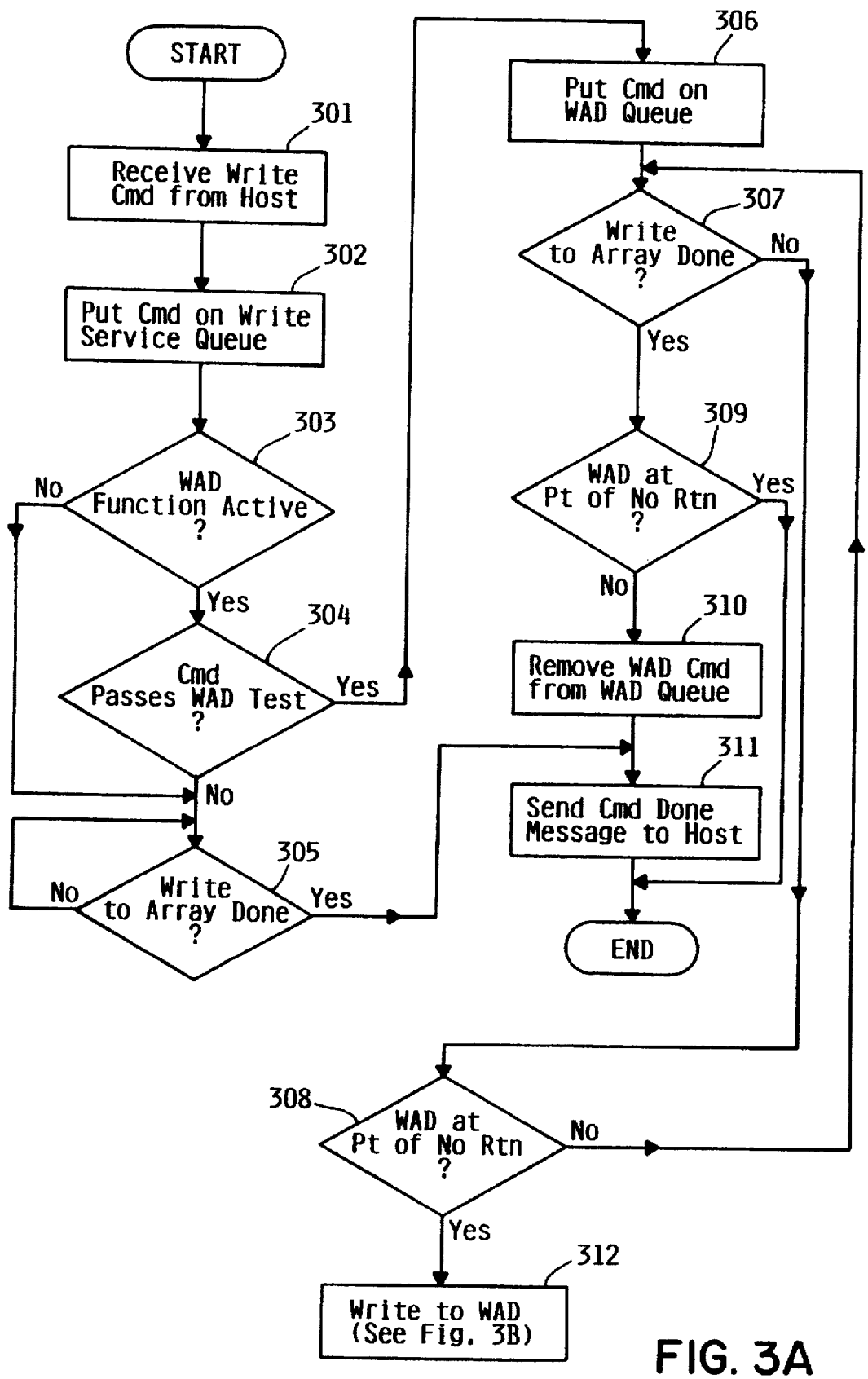
FIGS. 3A and 3B are a flow diagram showing the steps involved in performing a fast write task according the preferred embodiment.

A WRITE operation is performed by two asynchronous tasks which are part of control program 210 running in the array controller's processor 201. A first task (the fast write task, shown in FIGS. 3A and 3B) manages the write assist disk unit 104 and decides when to tell host 101 that the operation is complete. A second task (the service unit write task, shown in FIG. 4) performs the writing of data and updating of parity to the service disk units 105–108.

The WRITE operation in the array controller is triggered by receipt of a WRITE command from the host at step 301. The WRITE command is placed on a write service queue in memory 202 at step 302. The service unit write task will retrieve the command from the queue and process it in due course. The fast write task continues down the branch starting at step 303 in FIG. 3A.

The fast write task begins by checking status record 211 to determine whether the write assist function is active at step 303. This function may be deactivated if one of the service disks 105–108 has failed, and data on this service disk has been reconstructed on write assist disk 104, as described below. If the write assist function has been deactivated, the fast write task simply waits at step 305 for the service unit write task to complete. If the write assist function is active, the fast write task proceeds to analyze the command.

In the preferred embodiment, the write assist disk (WAD) unit 104 is not used for all WRITE operations. The fast write task first makes a determination whether assist unit 104 should be used for caching the WRITE data at step 304, as described more fully below. Analysis of performance of the storage subsystem of the present invention has shown that the greatest performance improvement is obtained from caching small WRITE operations, and that the relative performance improvement declines as the amount of data to be written becomes larger. Eventually, the data to be written can become sufficiently large that use of the write assist unit causes no improvement, or an actual decline in performance.

There are several reasons for this. The use of the write assist unit always entails additional work for the storage subsystem, because the amount of work required to update the service units remains unchanged. This additional overhead burden must be justified by the performance advantage gained by an early signalling that the operation is complete. The assist unit reduces seek and latency times by operating sequentially. For small WRITE operations, the response time attributable to seek and latency is relatively greater than for large WRITE operations, hence the performance improvement attributable to the assist unit is relatively greater. Additionally, where a large WRITE operation is writing data to two or more blocks on the same stripe of the service units, it is possible to omit or combine certain steps required to update the parity block (as described more fully below), so that fewer than two reads and two writes are required per block of data written. Finally, because there is only one write assist unit in the preferred embodiment, and a plurality of service units, it is possible for a backlog to develop in the assist unit.

Ideally, the determination whether to use the assist unit at step 304 is based on two considerations: the resources available for the operation, and an estimate of the time required to complete the write to the assist unit (as opposed to time required to complete the write to the service units). In the preferred embodiment, the assist unit will be used for a WRITE operation if all the following criteria are met:

(a) The number of data blocks in the WRITE command under consideration is less than Threshold #1, where Threshold #1 represents some limit on the size of buffers or other resources available to handle the WRITE command;

(b) The number of data blocks in the WRITE commands on the WAD queue is less than Threshold #2, this number being roughly proportional to the time to begin any new command added to the WAD queue; and (c) The number of data blocks in the WRITE command plus the number of data blocks on the WAD queue is less than Threshold #3, this sum being roughly proportional to the time required to complete the write of the command under consideration to the assist unit, where Threshold #3 could represent either a limit on WAD queue resources or a maximum time allowed for completing a command.

Figure 5:
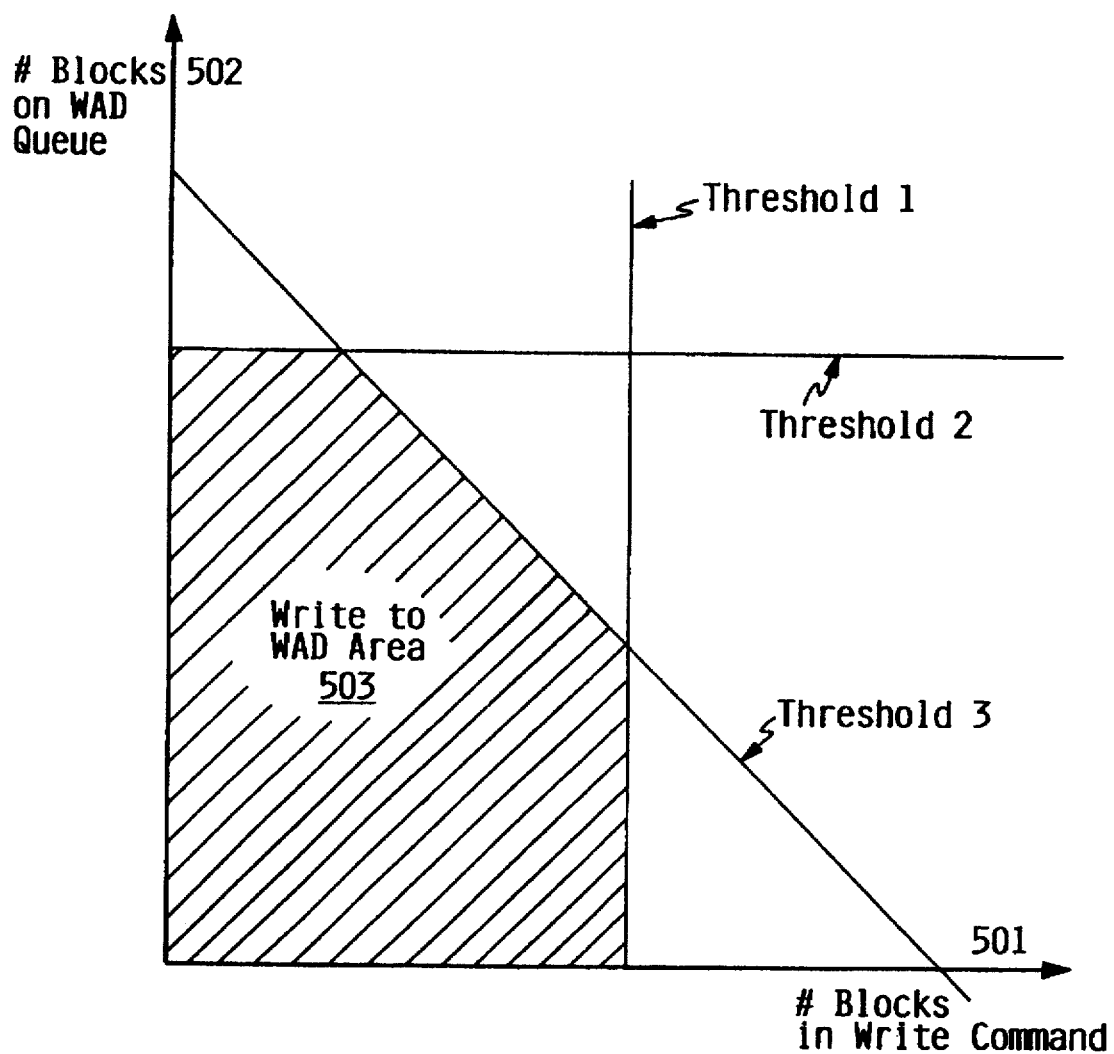
FIG. 5 is a graphical representation of a test to determine whether a WRITE command should be written to the write assist unit according to the preferred embodiment.

This test is shown graphically in FIG. 5. The axes 501,502 represent the number of blocks in the WRITE command under consideration and the number of blocks currently in the WAD queue, respectively. The shaded area 503 represents a determination that the assist unit should be used.

If controller 103 determines at step 304 that the WRITE operation does not meet the criteria for use of the write assist unit, the fast write task simply waits at step 305 for the service unit write task to complete. When the service unit task completes, the first task then sends a command complete message to host 101, acknowledging that the WRITE operation has completed, at step 311.

If controller 103 determines at step 304 that the WRITE operation meets the criteria for use of the write assist unit, the WRITE command is placed on a write assist disk queue at step 306 awaiting service by the assist unit 104. The fast write task then waits at steps 307–308 for either the service unit task to complete or the WRITE command in the write assist disk queue to reach a point of no return (i.e., to reach a point where the write assist unit 104 is ready to receive the data). If the service unit task completes first ("write to array done" at step 307), the write command is removed from the write assist disk queue at step 310, and a command complete message is sent to host 101 at step 311.

Figure 3B:
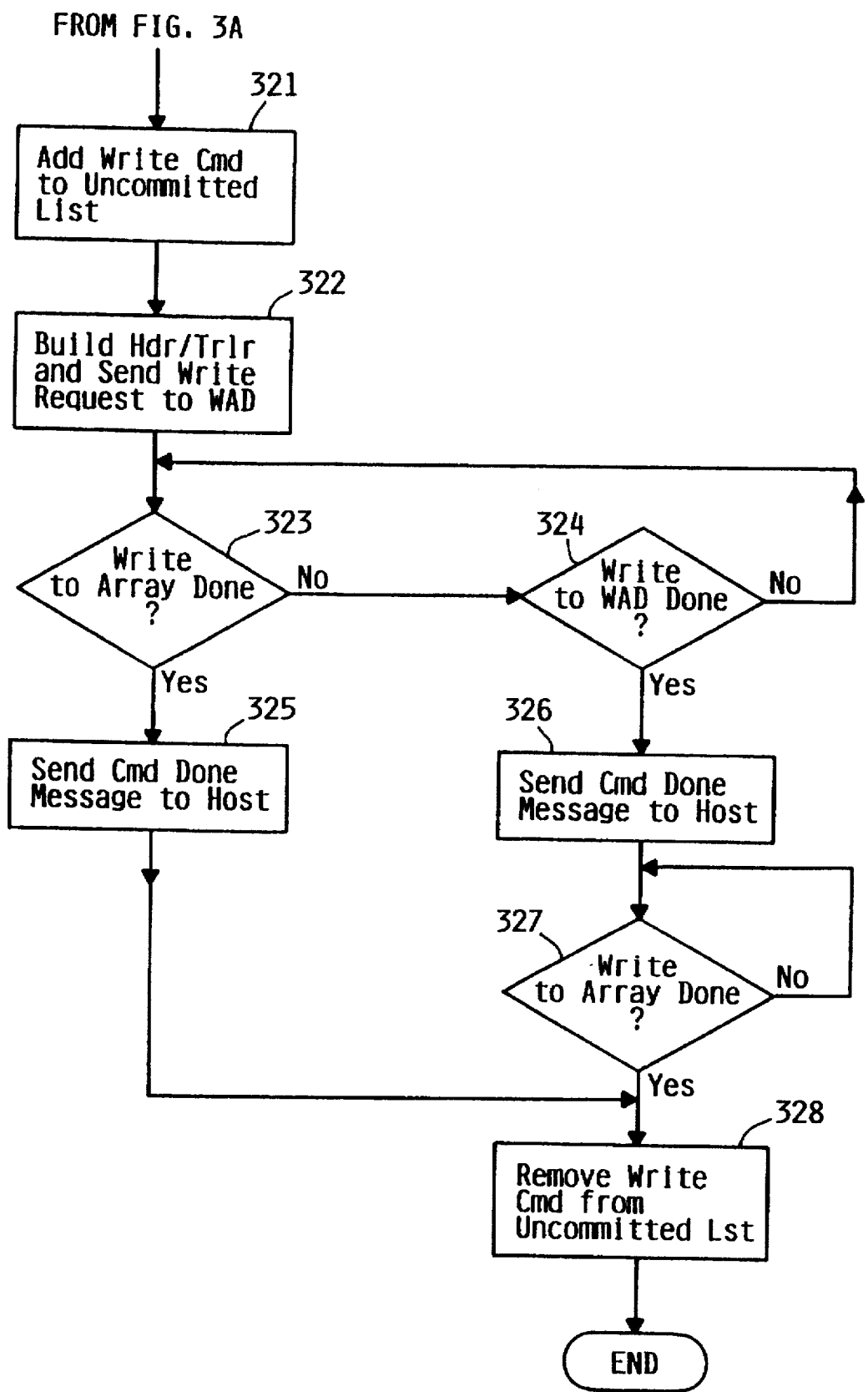

If the WRITE command on the write assist disk queue reaches the point of no return before the service unit task completes (step 308), the data is written to write assist unit 104 at step 312. The steps required to complete this part of the operation are shown in FIG. 3B. The WRITE command is first added to uncommitted list 212 in dynamic RAM 203 at step 321. Backup copies of the uncommitted list also exist in write assist unit 104, as more fully described below. The controller then builds a header and trailer onto the write data, and sends this data to write assist unit 104, at step 322. The fast write task then waits at steps 323,324 until either the write task to the service units completes or the data sent to the write assist unit is physically written to the assist unit. If the service unit write task completes first (step 323), controller 103 sends a command complete message to host 101 (step 325), and removes the WRITE command from the uncommitted list (step 328). If the writing of data to the write assist unit completes first (step 324), the controller sends the command complete message to host 101 at step 326. The fast write task then waits for the service unit task to complete at step 327. After the service unit task has completed, the WRITE command is removed from the uncommitted list at step 328.

In typical operation, WRITE commands will be processed by following a path represented by blocks 301,302,303,304, 306,307,308,321,322,323,324,326,327, 328. In following this path, it will be observed that the command complete message is sent to the host (step 326) before the actual writing of data to the service units completes (step 327). Thus, the host is free to continue processing as if data contained in the WRITE command had actually been physically written to the storage units and parity updated, although in fact this has not necessarily been done.

Figure 4:
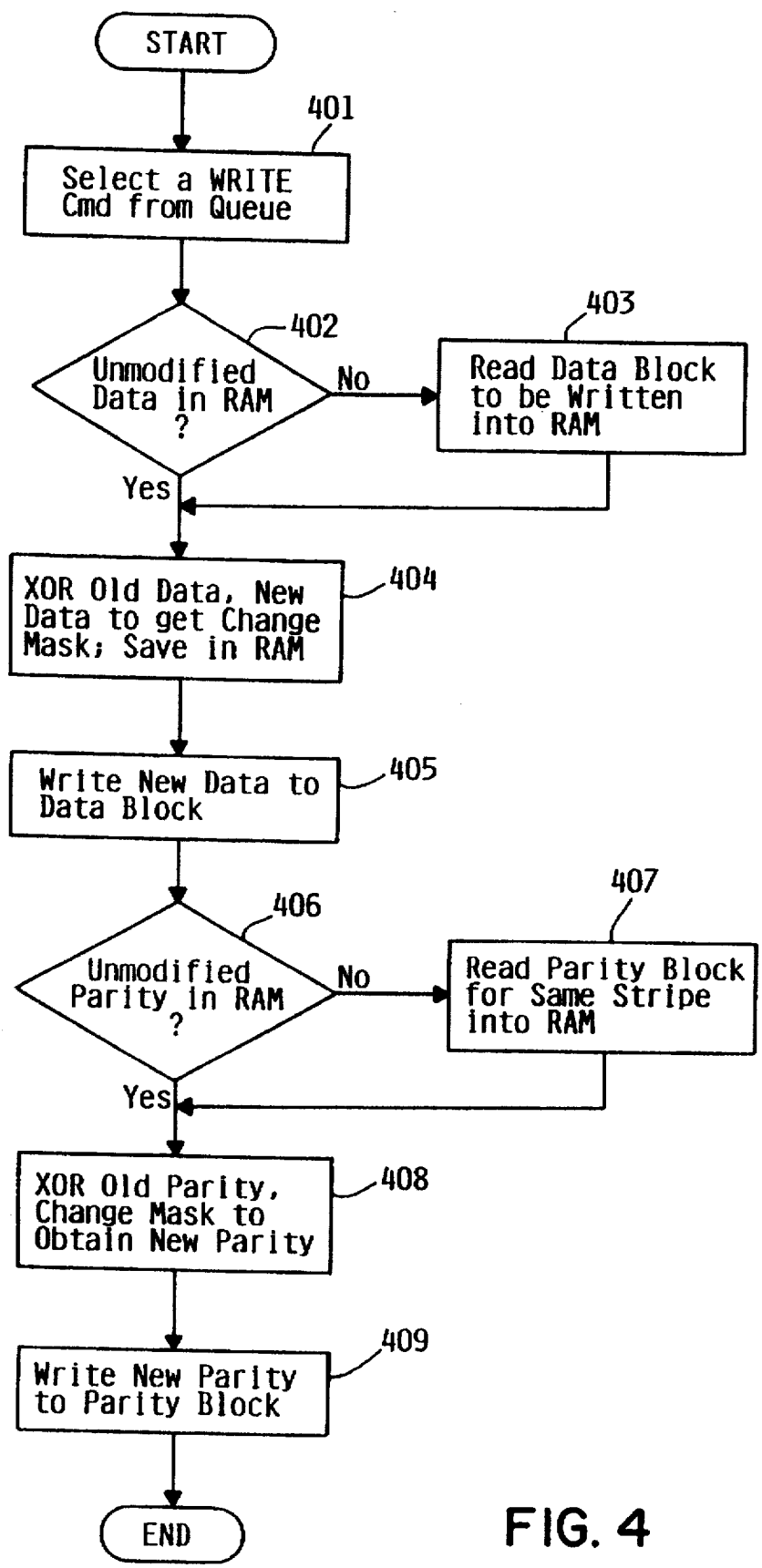
FIG. 4 is a flow diagram showing the steps involved in performing a service unit write task according to the preferred embodiment.

The second asynchronous task (service unit write task) writes data from dynamic RAM 203 to a service disk unit and updates parity. A flow diagram of this task is shown in FIG. 4. It selects a WRITE operation from among those queued in memory 202 at step 401. The selection criteria are not a part of this invention, and could be, e.g., FIFO, shortest seek/latency, or some other criteria based on system performance and other considerations. When the WRITE operation is performed, parity must be updated. By taking the Exclusive-OR of the new write data with the old data, it is possible to obtain a bit map of those bits being changed by the WRITE operation. Exclusive-ORing this bit map with the existing parity data will produce the updated parity data. Therefore, before writing to storage, the task first checks whether the old data exists in dynamic RAM 203 in unmodified form at step 402. If not, it must be read into RAM 203 from the data block on the service disk unit on which it is stored at step 403. This old data in RAM 203 is then Exclusive-ORed with the new data in RAM 203 to produce the bit map of changed data at step 404. The bit map is saved temporarily in RAM 203 while the new data is written to the same data block on the appropriate service disk unit at step 405. The old parity data is then read into RAM 203 (if not already there) from the corresponding parity block in the same stripe of blocks at steps 406,407, and Exclusive-ORed with the bit map to produce the new parity data at step 408. This new parity data is written back to the same parity block on the disk unit at step 409, competing the second task. An appropriate message or interrupt is passed to the first task when the second task completes.

The steps shown in FIG. 4 are typical of a small write operation, specifically, a write operation involving data stored on a single block of a service disk. Where a large write operation involves multiple blocks within the same stripe, it is possible to omit or combine certain steps to achieve a performance improvement. For example, where two blocks on a single stripe are being written to, the controller would typically (1) read data in a first block, (2) Exclusive-OR the data read with the new data to be written to produce a change mask, (3) write new data to the first block, (4) read data in a second block, (5) Exclusive-OR the data read with the change mask from the first block to update the change mask, (6) Exclusive-OR the change mask with the data to be written to the second block to again update the change mask, (7) write new data to the second block, (8) read the parity block, (9) Exclusive-OR the parity block with the change mask to produce the new parity, and (10) write the new parity. Note that in this case, although two separate blocks were updated, only three writes and three reads were required. In the case where most or all blocks within a stripe are being written to, it is more efficient to access all blocks rather than read before each write. In this case, the controller will first read each block not being updated, accumulating a parity by Exclusive-ORing, and then write each block being updated, again accumulating the parity by successive Exclusive-ORing. After the last write of data, the accumulated parity is written to the parity block. For these reasons, the use of the write assist disk unit is less attractive for large WRITE operations. Accordingly, in the preferred embodiment the controller makes an initial determination at step 303 whether the WRITE operation is sufficiently small that use of the write cache unit will be likely to improve performance.

Figures 6, 7:
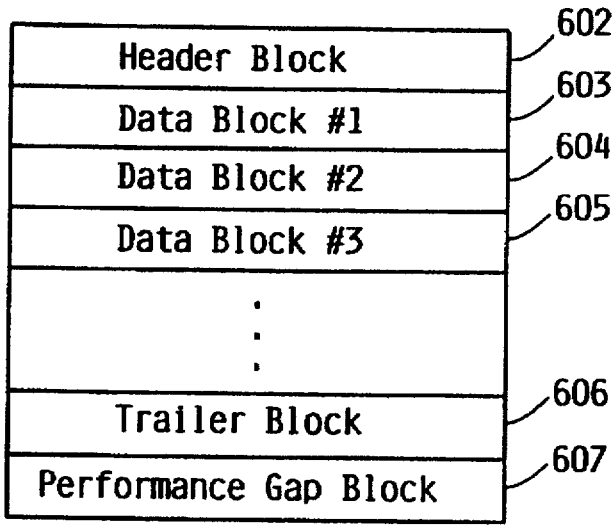
FIG. 6 shows the structure of a data record written to the write assist unit according to the preferred embodiment.
FIG. 7 shows the structure of a header/trailer block within a data record written to the write assist unit, according to the preferred embodiment.

In order to maintain data redundancy at all times, the information written to write assist unit 104 includes status information necessary to reconstruct data in the event the contents of dynamic memory 203 are lost. Therefore, for each write of data to the assist unit, the controller builds a header/trailer containing this status information as indicated at step 322. A high-level diagram of the structure of a data record written to assist unit 104 is shown in FIG. 6. A typical data record 601 comprises a header block 602, a variable number of data blocks 603–605, followed by a trailer block 606, and one of more blocks of a performance gap 607.

Header and trailer blocks 602,606 contain only status and other information needed to reconstruct data. The data itself which is written to the service units 105–108 is contained entirely within data blocks 603–605. Trailer block 606 is a verbatim copy of the first header block 602. The purpose of inserting trailer block 606 is to verify during data reconstruction that all data blocks were in fact written to the write assist unit 104.

Performance gap 607 is a predefined number of blocks containing undefined data. The purpose of gap 607 is to allow the controller sufficient time to process the next WRITE command where multiple commands are on the WAD queue. While the controller is processing the next WRITE command on the queue (i.e., building header/trailer, checking status) the write assist disk unit continues to rotate a small angular distance past the end of the record. If the next record is to be started at the immediately succeeding block location, the controller must wait for a full disk revolution to complete before the next write operation can begin. In order to avoid this, performance gap 607, which contains unused data, is inserted at the end of a record. By the time the disk rotates past the block(s) comprising performance gap 607, the controller will be ready for the next WRITE operation. While one performance gap block 607 is depicted in FIG. 6, it should be understood that the actual number of such blocks may vary depending on the characteristics of the disk unit.

In addition to data record 601, the controller will under certain circumstances write an update record to write assist unit 104. An update record comprises only the header block(s). The update record is appended to the end of a chain of data records 601 when no further WRITE operations are on the WAD queue awaiting writing to the assist unit 104. In this case, the update record is eventually overwritten with another update record (if there are status changes in the uncommitted list) or a data record which is added to the existing chain. The update record is also appended to a chain of data records 601 at the end of a disk sweep (i.e., the disk arm has swept across the entire disk surface, and must return to the starting point of its sweep to write the next record). Because data records are never split between the end and beginning of a sweep, an update record pointing to the start of a sweep will be inserted at the end of a chain whenever the disk space remaining in the sweep is insufficient to store the next data record.

The structure of a header or trailer block is shown in FIG. 7. The block contains command identifier 701, command address 702, number of status blocks 703, next command address 704, number of entries in uncommitted list 705, uncommitted list entries 706,707, padding 708, SCSI command 709 and command extension 710.

Command identifier 701 is a unique 4-byte identifier generated by controller 103 and associated with the write record 601. The controller increments the identifier by 1 each time it writes a new record to write assist unit 104; the identifier wraps to 0 after reaching X 'FFFFFFFF' When traversing a chain of commands stored on the assist unit as part of data reconstruction (as described below), the identifier is used to verify that the next record is indeed part of the chain.

Command address 702 contains the address on the write assist unit at which the record begins. Number of status blocks 703 contains the number of blocks in the header record. In the preferred embodiment, this number is typically 1 (each block containing 520 bytes of data). However, if the uncommitted list is unusually long, the header could occupy more than one block. The trailer, on the other hand, repeats only the first block of the header, even where the header comprises multiple blocks.

Next command address 704 contains the address on the write assist unit at which the next record in the chain is stored. In the case of a data record, this is the address of the block immediately after performance gap 607 (which is the start of either an update record or the next data record). In the case of an update record which was appended to the last data record in a chain, the next command address is the starting address of the update record itself (i.e., the update record points to itself as the next block, signalling the end of the chain). If the update record was generated because the record was the last record in a disk arm sweep, the next address in the header block points to the beginning address of the write assist disk. When the write assist disk is initially formatted, an empty update record containing only a header block is inserted at the beginning address; in this case, the next command address of this header block points to itself. Thus, in traversing a chain of records during data reconstruction, the controller will follow each pointer in next command address 704 until it encounters one which points to itself.

Number of entries 705 contains the number of entries in the uncommitted list which follows. Each entry 706,707 in the uncommitted list is an address on the write assist unit of a header block for a record which has not yet been written to the service units, as described above. The uncommitted list in the header/trailer block is a copy of the uncommitted list 212 in dynamic RAM as it existed at the time the header/trailer was generated. Once written, the uncommitted list in a data record is not updated to reflect the current state of the uncommitted list 212 in dynamic RAM. Instead, a more recent uncommitted list will be recorded in a subsequently written header of a data or update record. Although two entries 706,707 are shown in FIG. 7, the actual number of entries is variable.

SCSI command 709 and Command extension 710 are stored at a fixed location relative to the end of the header/trailer block. Padding 708 contains unused data of variable length required to fill the block to the beginning of SCSI command 709. SCSI command 709 contains the write command issued to the service units 105–108, which in the preferred embodiment employ a Small Computer Systems Interface (SCSI) protocol for communication with the controller 103. Among other things, SCSI command contains the length of the data to be written, which data follows the header block. Command extension 710 may contain additional command parameters not part of the SCSI command. In the preferred embodiment, command extension 710 is used for a bit-mapped skip mask, enabling selected data blocks in the record to be written while others are skipped.

The storage subsystem of the present invention is designed to preserve data in the event of failure of any single disk unit or loss of contents of the array controller dynamic memory 204. In the former event, the subsystem can dynamically recover and continue operation. The latter event is generally indicative of a loss of system power or such other catastrophic event in which the system as a whole is affected. In this case, the integrity of data on the storage units is preserved, although the controller will not necessarily be able to continue operation until the condition causing the failure is corrected.

From the perspective of array controller 103, each storage unit 104–108 is a self-contained unit which is either functioning properly or is not. The storage unit itself may contain internal diagnostic and error recovery mechanisms which enable it to overcome certain types of internal defects. Such mechanisms are beyond the scope of the present invention. As used herein, the failure of a storage unit means failure to function, i.e., to access data. Such a failure may be, but is not necessarily, caused by a breakdown of the unit itself. For example, the unit could be powered off, or a data cable may be disconnected. From the perspective of the controller, any such failure, whatever the cause, is a failure of the storage unit. Detection mechanisms which detect such failures are known in the art.

In the event of failure of write assist unit 104, array controller 103 updates its status information in non-volatile RAM to reflect that the assist unit is no longer in service, and thereafter continues operation of the service units as before, without using the write assist unit.

Figure 8:
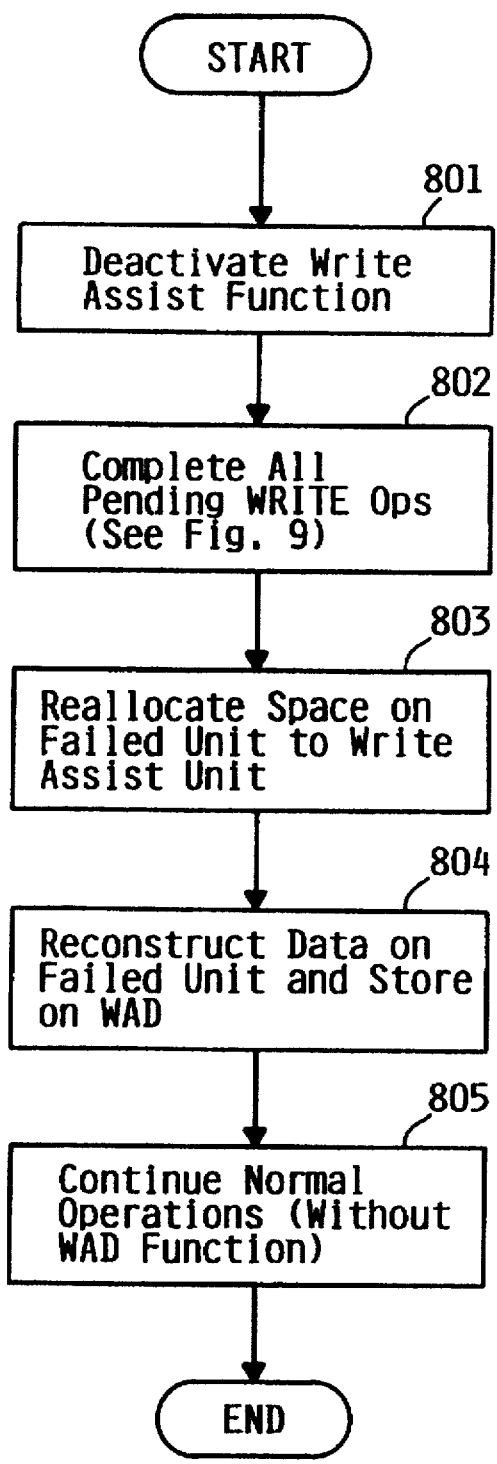
FIG. 8 is a high-level flow diagram showing the steps taken by the array controller in the event of failure of one of the service disk units, according to the preferred embodiment.
Figure 9:
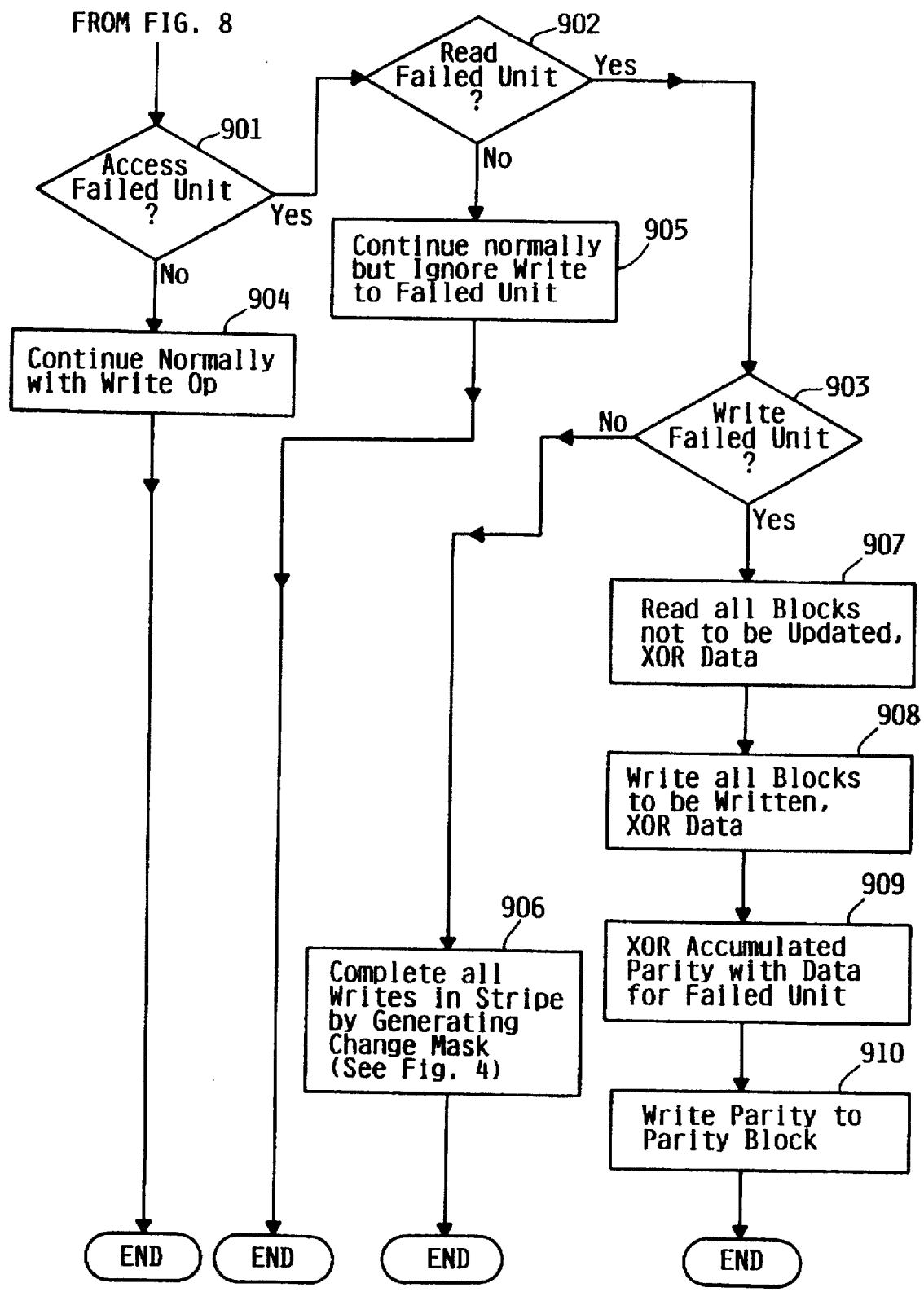
FIG. 9 shows the steps required to complete any incomplete write operations in the event of failure of one of the service disk units, according to the preferred embodiment.

FIGS. 8 and 9 represent the steps taken by array controller 103 in the event a failure of one of the service units 105–108 is detected. FIG. 8 is a high-level flow diagram of the overall recovery process. The controller first deactivates the write assist function so that no more WRITE commands are written to the write assist unit at step 801. The controller then completes the writing of any incomplete WRITE operations in its uncommitted list 212 to the service units, including the updating of parity, at step 802. The controller then dynamically reassigns storage space previously allocated to the failed service unit to the write assist unit at step 803. Data on the failed service unit is then reconstructed by Exclusive-ORing the data at the same location on the remaining service units, and saved on the unit formerly allocated as the write assist unit, at step 804. There may be some overlap of steps 802–804. The subsystem then continues normal function without write assist, with the write assist unit 104 performing the function of the failed service unit, at step 805.

FIG. 9 illustrates the steps required to complete any incomplete WRITE operations, which are represented in FIG. 8 by the single block 802. There are several possible cases, each of which requires individual consideration. If the incomplete write operation does not require any further access to the failed service unit (step 901), then the write operation proceeds normally at step 904. This would be the case either where the write operation never required access to the failed unit, or where the failed unit had already been accessed prior to its failure. If access is required, but no read access is required (i.e., only write access is required, step 902), then the controller simply omits the write to the failed disk unit, and otherwise continues the write operation normally as if the failed unit had been written to at step 905. This would be the case, for example, where steps 402,403 of FIG. 4 had been completed prior to the disk unit failure, but where step 405 had not. It could also occur, for example, where a write operation involves all or nearly all of the blocks on a single stripe, and instead of reading each block before writing to produce a change mask as shown in FIG. 4, the blocks are either read only or written to only, and a change mask accumulated with each read or write, as described above.

If read access to the failed unit is required but write access is not, (step 903), then the incomplete write operation is a multi-block write operation updating most of the blocks in the stripe, but not affecting the block on the failed unit. Because unaffected blocks are read before affected blocks are written to, none of the affected blocks has yet been altered. In this case it is possible to complete the incomplete write operation by reading each block to be updated before writing to it and accumulating a change mask, using the procedure of FIG. 4, at step 906.

The final case is where both read and write access to the failed unit is required (the "yes" branch from block 903). In this case the blocks on the same stripe in all remaining service units (other than the unit containing the parity block) are either read (if not requiring updating) at step 907 or written to at step 908, and the data from each respective read or write successively Exclusive-ORed to accumulate parity. This partial parity is Exclusive-ORed with the data to be written to the failed unit to obtain the new parity at step 909, which is then written to the parity block at step 910.

It will be appreciated that the array controller may have completed some of the steps explained above for a write operation at the time a disk unit fails, and in that case it would be unnecessary to repeat such steps because the product (change mask, read data, etc.) would be in the controller's dynamic memory 203.

After the incomplete write operations have been completed as described above, the write assist unit can assume the function of the failed service unit. The controller will update its status information to reflect that the failed unit is no longer serviceable and the write assist unit is now the repository of the data formerly contained on the failed service unit. Data on the failed service unit can either be reconstructed at once, or can be reconstructed in blocks on demand. Such dynamic reconstruction techniques are described in U.S. patent application Ser. No. 07/542,216, filed Jun. 21, 1990, herein incorporated by reference.

In the event of loss of the contents of controller memory, the data to be written, as well as the list of incomplete write operations, will be contained in the write assist unit 104. After controller operation is restored, the controller locates the most recent uncommitted list on the write assist unit, loads this list into its dynamic memory, and performs each write operation on the list to make the storage subsystem current. Because the most recent uncommitted list on the write assist unit is not necessarily updated each time a write operation completes, it is possible that some write operations on the uncommitted list will have already completed. However, rewriting this data will not affect data integrity.

Figure 10:
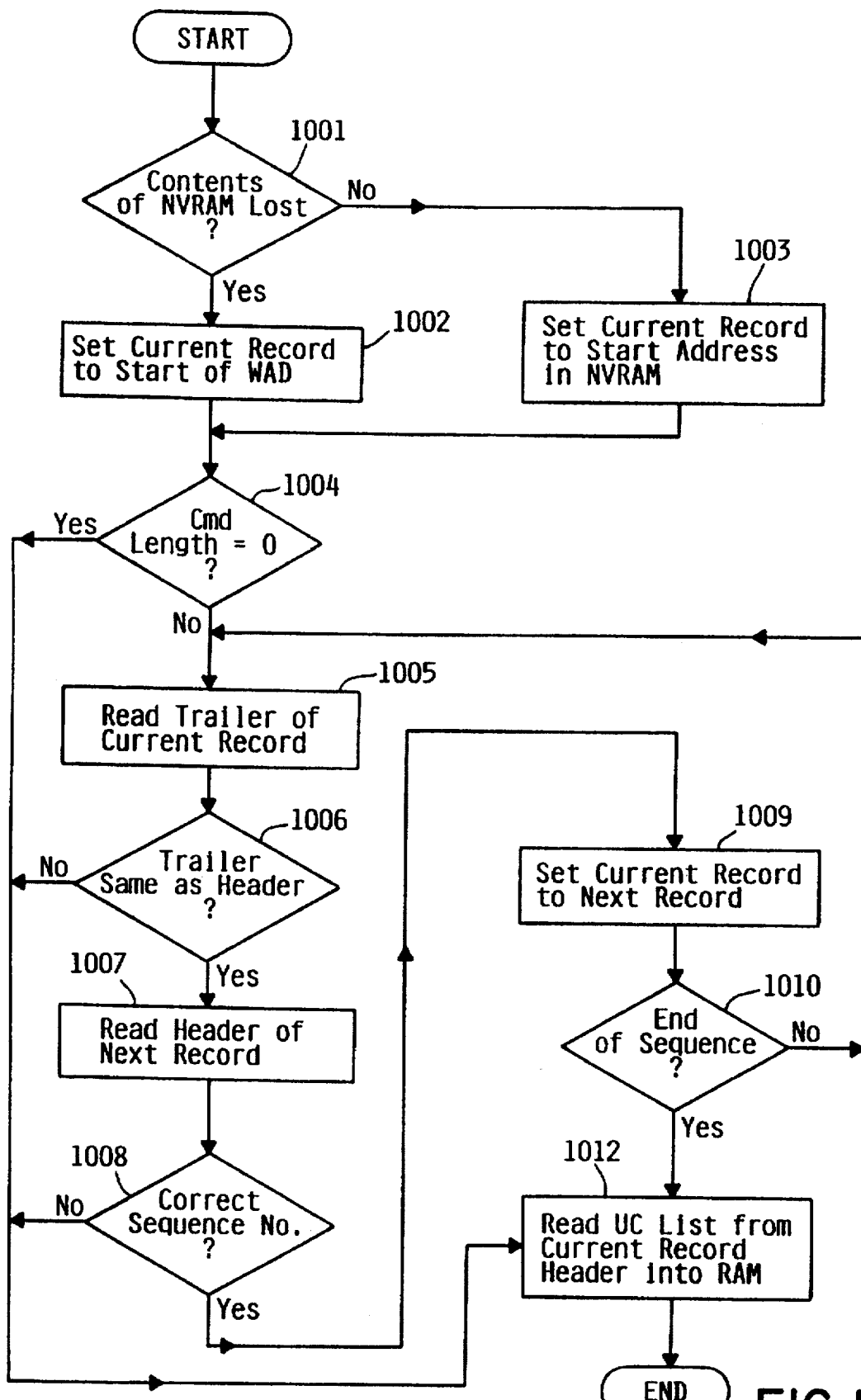
FIG. 10 shows the steps required to complete all incomplete WRITE operations identified on an uncommitted list recovered from the write assist unit, according to the preferred embodiment.

FIG. 10 shows the steps required to obtain the most recent uncommitted list from write assist disk unit 104. The controller first checks the status record 211 in non-volatile RAM 204 for the address of a recent WAD record. If the contents of non-volatile RAM 204 have been lost (step 1001), the current record is initialized to a block at a predefined location at the start of a disk sweep, at step 1002. The block at this location is always a header block, and will be either the header for a data record, the header for an update record at the end of a chain of data records, or the header of the initial record placed on the disk when formatted. If the contents of non-volatile RAM 204 are intact (step 1001), the current record is initialized to the record pointed to by the address value saved in non-volatile RAM. Since this value is periodically updated by the controller during actual operation, it is generally closer to the end of the chain of WAD records than a record at the first address on the write assist unit. However, the chain of records on the assist unit can be traversed in either case. The controller reads the header of this first record.

If the command length specified in field 709 of header block 602 is 0 (indicating it is not a data record) (step 1004), then the header at the predefined location contains the most current uncommitted list, and this uncommitted list is loaded into the controller's dynamic memory 203 at step 1012. If the command length in step 1004 is not 0, the header is part of a data record. The controller then reads the trailer block of the data record, which is located an the offset from the header specified by the command length, at step 1005. The controller then compares the trailer to the header at step 1006. If the blocks are not identical, then the writing of data was interrupted between the time that the header and trailer were written. In this case, the current data record is taken as the end of the chain, and the uncommitted list in the header is the most recent uncommitted list available. The controller loads this list into dynamic memory at step 1012 and ends. If the trailer agrees with the header, the controller reads the header of the next record on the write assist unit at step 1007. This record is located at the address specified in next address field 704 of the header for the current record. If the command ID specified in field 701 of the header for the next record is not one more than that of the current record (step 1008), the sequence of records has been interrupted, and the uncommitted list from the current record is saved as the most recent uncommitted list at step 1012. If the command ID in the header of the next record is exactly one more than that of the current record (step 1008), then the next record is indeed part of the same chain. In this case, the next record becomes the "current" record at step 1009. The controller then checks the current record header to determine whether the current record is another data record or an update record at step 1010. If it is an update record (indicated by the next record address field 704 being the same as the command address field 702, i.e., the record points to itself), the end of the chain has been reached, and the uncommitted list from the current record header is loaded in memory at step 1012. If the current record is another data record at step 1008, the program loops to step 1005, and repeats steps 1005–1010 until a termination condition is encountered.

Figure 11:
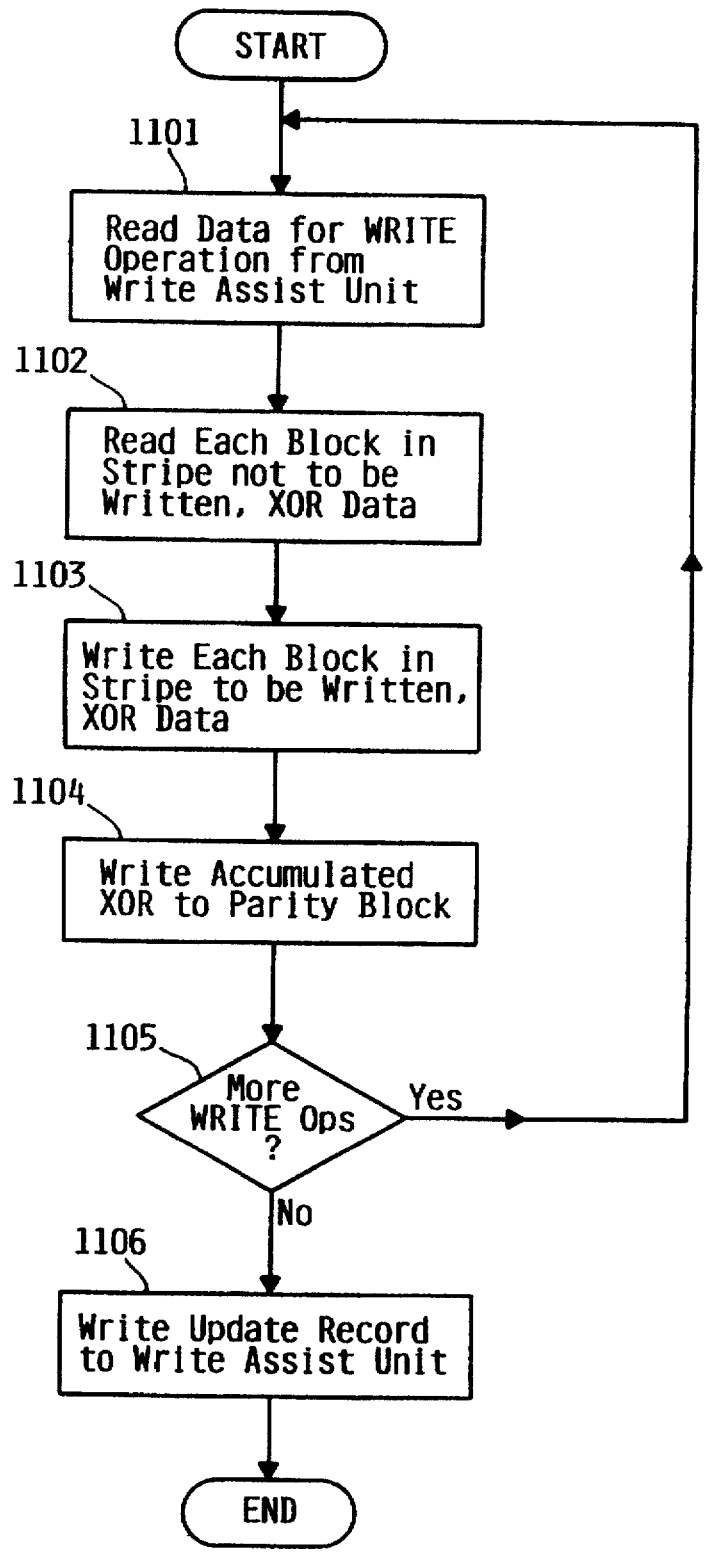

FIG. 11 shows the steps required to complete all incomplete WRITE operations identified on the uncommitted list, once the uncommitted list has been recovered using the procedure shown in FIG. 10. Because a WRITE operation on the uncommitted list may have been interrupted at any point, it must be assumed that parity blocks in the same stripe as data blocks to be written may contain erroneous parity. Accordingly, the procedure illustrated in FIG. 4 can not be employed to complete the WRITE operations. For each write operation on the uncommitted list, the controller first retrieves the data to be written from the write assist unit 104, and stores it in dynamic memory 203, at step 1101. The controller then reads all data blocks on the stripe to be written to which do not require updating, and accumulates a new partial parity by Exclusive-ORing each successively read data block, at step 1102. The controller then writes the data blocks to be written to the respective service units, and successively Exclusive-ORs each written block with the partial parity to obtain the new parity, at step 1103. It should be noted that steps 1102 and 1103 may involve no blocks read and all data blocks in the stripe written to, or may involve all data blocks but one read and only one written to, or any intermediate combination. The final step is to write the new parity to the parity block at step 1104. Steps 1102–1104 are repeated until all write operations on the uncommitted list are completed (step 1105). An update record containing an empty uncommitted list is then written to the end of the record chain on the write assist unit at step 1106.

In the preferred embodiment, a single array controller services a plurality of disk drives in a storage subsystem. The disk drives themselves are redundant, enabling the subsystem to continue operation in the event of failure of a single drive, but the controller is not. Alternatively, it would be possible to operate the storage subsystem with multiple redundant controllers, enabling the system to remain operational in the event of failure of any single controller. Because the write assist unit maintains data redundancy, it would not be necessary for the multiple controllers to contain redundant uncommitted lists, command queues, and other data. For example, assuming proper physical connections exits, it would be possible to operate a subsystem having controllers A and B, in which controller A services disk drives 1 to N, and B services disk drives (N+1) to 2N. In the event of failure of any one controller, the other would service all disk drives 1 to 2N, using the information in the write assist unit to recover incomplete write operations. In this case, the subsystem would continue to operate despite the failure of a single controller, although its performance may be degraded.

In the preferred embodiment, a single write assist unit is associated with a single parity group of service units (i.e., a group of service units which share parity). However, it would alternatively be possible to operate a storage subsystem according to the present invention with multiple write assist units. Additionally, it would be possible to operate a subsystem having multiple parity groups, in which one or more write assist units are shared among the various parity groups of service units.

In the preferred embodiment, the service units are organized as a RAID level 5. Each stripe of storage blocks in the service units comprises a plurality of data blocks and a single parity block (data redundancy block). Multiple stripes exist, in which the parity blocks are distributed among different service units. The use of a single parity block provides the simplest form of data redundancy, and it is believed that distributing the parity blocks provides the best performance. However, in the alternative it would be possible to practice the present invention using other types of storage unit arrays. For example, there could be but a single stripe of blocks, or all parity blocks could be on a single service unit, as in the case of a RAID-3 or RAID-4. Rather than a single parity block, it would be possible to practice this invention using more complex error correcting or detecting codes or multi-dimensional parity stored on multiple data redundancy blocks, as in the case of a RAID-2.

In the preferred embodiment, all storage units have the same storage capacity. This simplifies the control mechanism and facilitates substitution of one unit for another. However, it would alternatively be possible to practice the present invention to units of varying capacities. In particular, the write assist unit might be larger than the service units, enabling it to maintain write assist function even if it is also used to store data reconstructed from a failed storage device.

In the preferred embodiment, the write assist unit is used as a sequentially written log of the incomplete write operations. However, it may alternatively be possible to use the write assist unit in other ways. For example, data would not have to be sequentially written to the assist unit, and could be random access. The assist unit could be used for other purposes, such as a read cache. The assist unit might be used in an assist mode for any function which would improve performance and/or redundancy, while simultaneously having the capability to switch to a service unit operating mode, thereby doubling as a spare unit.

In the preferred embodiment, the storage units are rotating magnetic disk drive storage units. Such units are standard in the industry at the present time. However, it would be possible to operate a storage subsystem according to the present invention having storage units employing a different technology. For example, optical disk storage units may be employed.

Although a specific embodiment of the invention has been disclosed along with certain alternatives, it will be recognized by those skilled in the art that additional variations in form and detail may be made within the scope of the following claims.

What is claimed is:

1. A storage subsystem for a computer system, comprising:
   a storage subsystem controller, said controller having a processor and a memory;
   at least four data storage units coupled to said controller, wherein at least one of said data storage units is a write assist data storage unit, and at least three of said data storage units are service data storage units;
   at least one stripe of storage blocks, each stripe comprising a plurality of dam storage blocks for containing data and at least one data redundancy storage block for containing data redundant of the data stored in said data storage blocks, each of said storage blocks being contained on a respective service data storage unit;
   means in said controller for maintaining said data redundancy storage block on said stripe of storage blocks;
   means in said controller for receiving write dam, said write data being data to be written to said data storage units;
   selection means, responsive to said means in said controller for receiving write data, for selectively determining whether said received write data should be written to said write assist unit, said write data being of varying length, and said selection means selectively determining whether individual ones of a plurality of write commands should be written to said write assist unit based upon the length of each respective write data;
   means for writing said write data to said write assist unit, wherein said means for writing said write data to said write assist unit selectively writes said write data to said write assist unit in response to said determination made by said selection means;
   means in said controller for signalling operation complete after writing write data to said write assist unit and before writing said write data to any of said service data storage units;
   means for reconstructing said data in the event any one of said data storage units fails after signalling operation complete; and
   means for reconstructing said data in the event the contents of said memory are lost after signalling operation complete.

2. The storage subsystem of claim 1, further comprising means for storing data reconstructed from a failing service data storage unit on said write assist unit.

3. The storage subsystem of claim 2, further comprising means for operating said write assist unit as said failing service unit after said data reconstructed from said failing service unit has been stored on said write assist unit.

4. The storage subsystem of claim 1, wherein said data redundancy storage block comprises a parity storage block for containing the parity of data stored in said data storage blocks.

5. The storage subsystem of claim 4, further comprising:
   at least two of said stripes of storage blocks,
   wherein said parity storage blocks are distributed among said service data storage units in a round robin manner.

6. The storage subsystem of claim 1, wherein said means for writing said write data to said write assist unit writes said write data to sequential locations on said write assist unit.

7. A storage apparatus for a computer system, comprising:
   a write assist data storage unit;
   a plurality of service data storage units;
   means for maintaining clam redundancy among said plurality of service dam storage units;
   means for receiving write dam, said write data being data to be written to said plurality of service data storage units;
   selection means for selectively determining whether said write data should be temporarily stored in said write assist unit, wherein said write data is contained in a plurality of write commands, said write data being of varying length, said selection means selectively determining whether individual ones of said plurality of write commands should be written to said write assist unit based upon the length of said write data associated with each respective write command;

means for temporarily storing said write data in said write assist unit, wherein said means for temporarily storing said write data in said write assist unit selectively writes said write data to said write assist unit in response to said determination made by said selection means;

means for reconstructing data stored on a service data storage units in the event of failure of said unit; and means for storing said reconstructed data on said write assist unit.

8. The storage apparatus of claim 7, wherein said means for maintaining data redundancy comprises:

at least one stripe of storage blocks, each stripe comprising a plurality of data storage blocks for containing data and one parity storage block for containing parity of the data stored in said data storage blocks, each of said storage blocks being contained on a respective service data storage unit;

means for determining the parity of said plurality of data storage blocks; and means for storing said parity of said plurality of data storage blocks in said parity storage block.

9. The storage apparatus of claim 7, further comprising:

means for disabling the write assist function of said write assist unit in the event of failure of a service data storage unit; and means for operating said write assist unit as said service unit which failed.

10. The storage apparatus of claim 9, wherein said means for maintaining data redundancy comprises:

at least one stripe of storage blocks, each stripe comprising a plurality of data storage blocks for containing data and one parity storage block for containing parity of the data stored in said data storage blocks, each of said storage blocks being contained on a respective service data storage unit;

means for determining the parity of said plurality of data storage blocks; and means for storing said parity of said plurality of data storage blocks in said parity storage block.

11. The storage apparatus of claim 7, wherein said means temporarily storing said write data in said write assist unit temporarily stores said write data in sequential locations on said write assist unit.

12. A method for storing data in a computer system, comprising the steps of:

storing data redundantly on a plurality of service data storage units;

selectively determining whether updated data to be written to said plurality of service units should be written to a write assist data storage unit, said updated data associated with a plurality of write commands, said updated data being of varying length;

writing said updated data to said write assist data storage unit, said writing step being performed in response to said selectively determining step determining that said updated data should be written to said write assist unit, wherein said selectively determining step selectively determines whether individual ones of said plurality of write commands should be written to said write assist unit based upon the length of the updated data associated with each respective write command;

signalling that said updated data has been written to said plurality of service data storage units;

writing said updated data redundantly to said plurality of service data storage units, wherein said step of writing said updated data to said plurality of service data storage traits is completed after said signalling step;

reconstructing data stored in a service data storage unit in the event of failure of said service data storage unit; and storing said reconstructed data on said write assist unit, and thereafter operating said write assist unit as said service unit which failed, in the event of said failure of said service data storage unit.

13. The method of claim 12, wherein said step of storing data redundantly on a plurality of service data storage units comprises storing data on at least one stripe of storage blocks, each stripe comprising a plurality of data storage blocks for containing data and one parity storage block for containing parity of the data stored in said data storage blocks, each of said storage blocks being contained on a respective service data storage unit; and wherein said step of writing said updated data redundantly to said plurality of service data storage units comprises updating said parity storage block of a stripe of storage blocks being updated.

14. The method of claim 11, wherein said step of writing updated data to be written to said plurality of service data storage units to a write assist data storage unit comprises writing said updated data to sequential locations on said write assist unit.

15. A storage subsystem controller for a computer system, comprising:

a processor;

a memory;

a host interface for communicating with a host computer system;

a storage unit interface for communicating with at least four data storage units coupled to said controller, wherein at least one of said data storage units is a write assist data storage unit, and at least three of said data storage units are service data storage units, wherein said service data storage units comprise at least one stripe of storage blocks, each stripe comprising a plurality of data storage blocks for containing data and at least one data redundancy storage block for containing data redundant of the data stored in said data storage blocks, each of said storage blocks being contained on a respective service data storage unit;

means for maintaining said data redundancy storage block on said stripe of storage blocks;

means for receiving write data from said host computer system, said write data being data to be written to said data storage units, said write data having varying lengths, said write data associated with a plurality of write commands;

selection means, responsive to said means for receiving write data from said host computer system, for selectively determining whether said received write data should be written to said write assist unit, said selection means selectively determining whether individual ones of said plurality of write commands should be written to said write assist unit based upon the length of said write data associated with each respective write command.

means for writing said write data to said write assist unit, wherein said means for writing said write data to said write assist unit selectively writes said write data to said write assist unit in response to said determination made by said selection means;

means for signalling operation complete to said host computer system after writing said write data to said write assist unit and before writing said write data to any of said service data storage units;

means for reconstructing said write data in the event any one of said data storage units fails after signalling operation complete; and means for reconstructing said write data in the event the contents of said memory are lost after signalling operation complete.

16. The storage subsystem controller of claim 15, further comprising means for storing data reconstructed from a failing service data storage unit on said write assist unit.

17. The storage subsystem controller of claim 16, further comprising means for operating said write assist unit as said failing service unit after said data reconstructed from said failing service unit has been stored on said write assist unit.

18. The storage subsystem controller of claim 15; wherein said data redundancy storage block comprises a parity storage block for containing the parity of data stored in said data storage blocks.

19. The storage subsystem controller of claim 15, wherein said means for writing said write data to said write assist unit writes data to sequential locations on said write assist unit.

* * * * *

UNITED STATES PATENT AND TRADEMARK OFFICE
CERTIFICATE OF CORRECTION

PATENT NO. : 5,708,668
DATED : January 13, 1998
INVENTOR(S) : David Alan Styczinski It is certified that error appears in the above-identified patent and that said Letters Patent is hereby corrected as shown below:

Claim 1, Column 15, Line 65: "dam" should be --data--

Claim 1, Column 16, Line 5: "dam" should be --data--

Claim 7, Column 16, Line 53: "clam" should be --data--

Claim 7, Column 16, Line 54: "dam" should be --data--

Claim 7, Column 16, Line 55: "dam" should be --data--.

Signed and Sealed this

Fourteenth Day of July, 1998

Attest:

Attesting Officer

BRUCE LEHMAN

Commissioner of Patents and Trademarks